(12) United States Patent
Sun et al.

(10) Patent No.: US 10,483,948 B2
(45) Date of Patent: Nov. 19, 2019

(54) RC OSCILLATOR, MOTOR-DRIVEN INTEGRATED CIRCUIT, AND MOTOR DEVICE

(71) Applicant: Johnson Electric S.A., Murten (CH)

(72) Inventors: Chiping Sun, Hong Kong (CN); Ken Wong, Hong Kong (CN); Huimin Guo, Hong Kong (CN); Yat Tung Lai, Hong Kong (CN); Shujuan Huang, Shenzhen (CN)

(73) Assignee: Johnson Electric International AG, Murten (CH)

( * ) Notice: Subject to any disclaimer, the term of this patent is extended or adjusted under 35 U.S.C. 154(b) by 120 days.

(21) Appl. No.: 15/803,180

(22) Filed: Nov. 3, 2017

(65) Prior Publication Data

US 2018/0131299 A1    May 10, 2018

(30) Foreign Application Priority Data

Nov. 4, 2016    (CN) .......................... 2016 1 0979484

(51) Int. Cl.
*H03K 3/011* (2006.01)
*H03K 3/0231* (2006.01)
*H03K 4/501* (2006.01)
*H03K 3/354* (2006.01)
*H02P 27/08* (2006.01)

(52) U.S. Cl.
CPC .............. *H03K 3/011* (2013.01); *H02P 27/08* (2013.01); *H02P 27/085* (2013.01); *H03K 3/0231* (2013.01); *H03K 3/354* (2013.01); *H03K 4/501* (2013.01)

(58) Field of Classification Search
CPC ........ H03K 3/011; H03K 3/0231; H03K 3/03; H03K 3/0315; H03K 3/354; H03K 4/501
See application file for complete search history.

(56) References Cited

U.S. PATENT DOCUMENTS 5,243,239 A * 9/1993 Khan ................... H03K 3/0231
327/552
5,889,441 A * 3/1999 Inn ....................... H03K 3/0231
331/111

(Continued)

FOREIGN PATENT DOCUMENTS

| CN | 103873048 A | 6/2014 |
| CN | 205301546 U | 6/2016 |
| EP | 1 378 998 A1 | 1/2004 |

OTHER PUBLICATIONS

Kong, "Lecture 2: CMOS Technology and Passive Devices", 2013, Retrieved from http://bwrcs.eecs.berkeley.edu/Classes/icdesign/ee240_sp13/lectures/Lecture02_Passives_2up.pdf on Apr. 22, 2019 (Year: 2013).*

(Continued)

*Primary Examiner* — Ryan Johnson
(74) *Attorney, Agent, or Firm* — Muncy, Geissler, Olds & Lowe, P.C.

(57) ABSTRACT

A RC oscillator comprises a resistor unit. The resistor unit can comprise at least one set of compensation resistor. Each set of compensation resistor comprises a positive temperature coefficient resistor and a negative temperature coefficient resistor coupled in series with the positive temperature coefficient resistor.

17 Claims, 8 Drawing Sheets

(56) References Cited

U.S. PATENT DOCUMENTS 6,462,625 B2 * 10/2002 Kim .................. H03B 5/04
331/176
9,391,549 B2 * 7/2016 Hirata ................ H02P 6/16

OTHER PUBLICATIONS

Li Jiang et al.; "Two High Accuracy CMOS RC Oscillators With Different Trimming Approach"; Solid-State and Integrated Circuit Tehnology (ICSICT), 2010 $10^{th}$ IEEE International Conference; Nov. 30, 2010; pp. 376-378.

Yu-Hsuan Chiang, et al.; "A Submicrowatt 1.1-MHz CMOS Relaxation Oscillator With Temperature Compensation"; IEEE Journal of Solid-State Circuits, vol. 60, No. 12, Dec. 31, 2013; pp. 837-841.

Yusuke Tokunaga, et al.; "An On-Chip CMOS Relaxation Oscillator With Voltage Averaging Feedback"; IEEE Journal of Solid-State Circuits, vol. 45, No. 6; Jun. 30, 2010; pp. 1150-1158.

B. Robert Gregoire, et al.; Process-Independent Resistor Temperature-Coefficients Using Series/Parallel and Parallel/Series Composite Resistors; Electrical Engineering and Computer Science, Oregon State University; May 31, 2007; pp. 2826-2829.

* cited by examiner

RC OSCILLATOR, MOTOR-DRIVEN INTEGRATED CIRCUIT, AND MOTOR DEVICE

CROSS REFERENCE TO RELATED APPLICATIONS

This non-provisional patent application claims priority under 35 U.S.C. § 119(a) from Patent Application No. 201610979484.8 filed in the People's Republic of China on Nov. 4, 2016.

FIELD OF THE INVENTION

This disclosure relates to a field of circuit technology. In particular, the present disclosure relates to a RC oscillator, a motor-driven integrated circuit for driving a motor, a motor device.

BACKGROUND OF THE INVENTION

Motor is an electromagnetic device which is based on electromagnetic induction law to achieve energy conversion, now the motor is widely used in household appliances, power tools, medical equipment and light industrial equipment. To achieve a high-performance motor control, a motor speed is needed to detect.

SUMMARY OF THE INVENTION

A RC oscillator comprises a resistor unit. The resistor unit can comprise at least one set of compensation resistor. Each set of compensation resistor comprises a positive temperature coefficient resistor and a negative temperature coefficient resistor coupled in series with the positive temperature coefficient resistor.

Preferably, the RC oscillator comprises a plurality of sets of compensation resistor.

Preferably, the plurality of sets of compensation resistor are coupled in series, each of or some of plurality of sets of compensation resistor are coupled with a selection switch in parallel.

Preferably, the plurality of sets compensation resistor are disposed in a plurality of parallel branches, each of or some of plurality of parallel branches are coupled with a selection switch in series.

Preferably, the positive temperature coefficient resistor is made of at least one of N+ diff w/o silicide, P+ poly w/i silicide, P+ diff w/o silicide, P+ diff w/i silicide, N+ poly w/i silicide, N+ diff w/i silicide.

Preferably, the negative temperature coefficient resistor is made of at least one of P+ poly w/o silicide and N+ poly w/o silicide.

Preferably, the positive temperature coefficient resistor is made of N+ diff w/o silicide and the negative temperature coefficient resistor is made of N+ poly w/o silicide.

Preferably, an absolute value of a linear temperature coefficient of the positive temperature coefficient is larger than an absolute value of a linear temperature coefficient of the negative temperature coefficient.

Preferably, a ratio of the absolute value of the positive temperature coefficient resistor and the negative temperature coefficient resistor is less than ten.

Preferably, second order temperature coefficients of the positive and negative temperature coefficient resistors are less than 1E-6/° C.

Preferably, the RC oscillator further comprises a capacitor is coupled with the resistor unit in series, wherein the capacitor is a metal insulator metal capacitor.

A motor-driven integrated circuit comprises the RC oscillator as described-above.

Preferably, a highest frequency of a system clock signal output by the RC oscillator is larger than 50 MHz.

Preferably, a highest frequency of a system clock signal output by the RC oscillator is not less than 80 MHz.

Preferably, during a power-on period of the motor-driven integrated circuit, a frequency of the system clock signal output by the RC oscillator is one quarter of the highest frequency of a system clock signal.

Preferably, during a power-on period of the motor-driven integrated circuit, a frequency of the system clock signal is 20 MHz-30 MHz.

A motor device comprises a motor-driven integrated circuit as described-above.

BRIEF DESCRIPTION OF THE DRAWINGS

A preferred embodiment of the invention will now be described, by way of example only, with reference to figures of the accompanying drawings. In the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

DETAILED DESCRIPTION OF THE PREFERRED EMBODIMENTS

Figure 1:
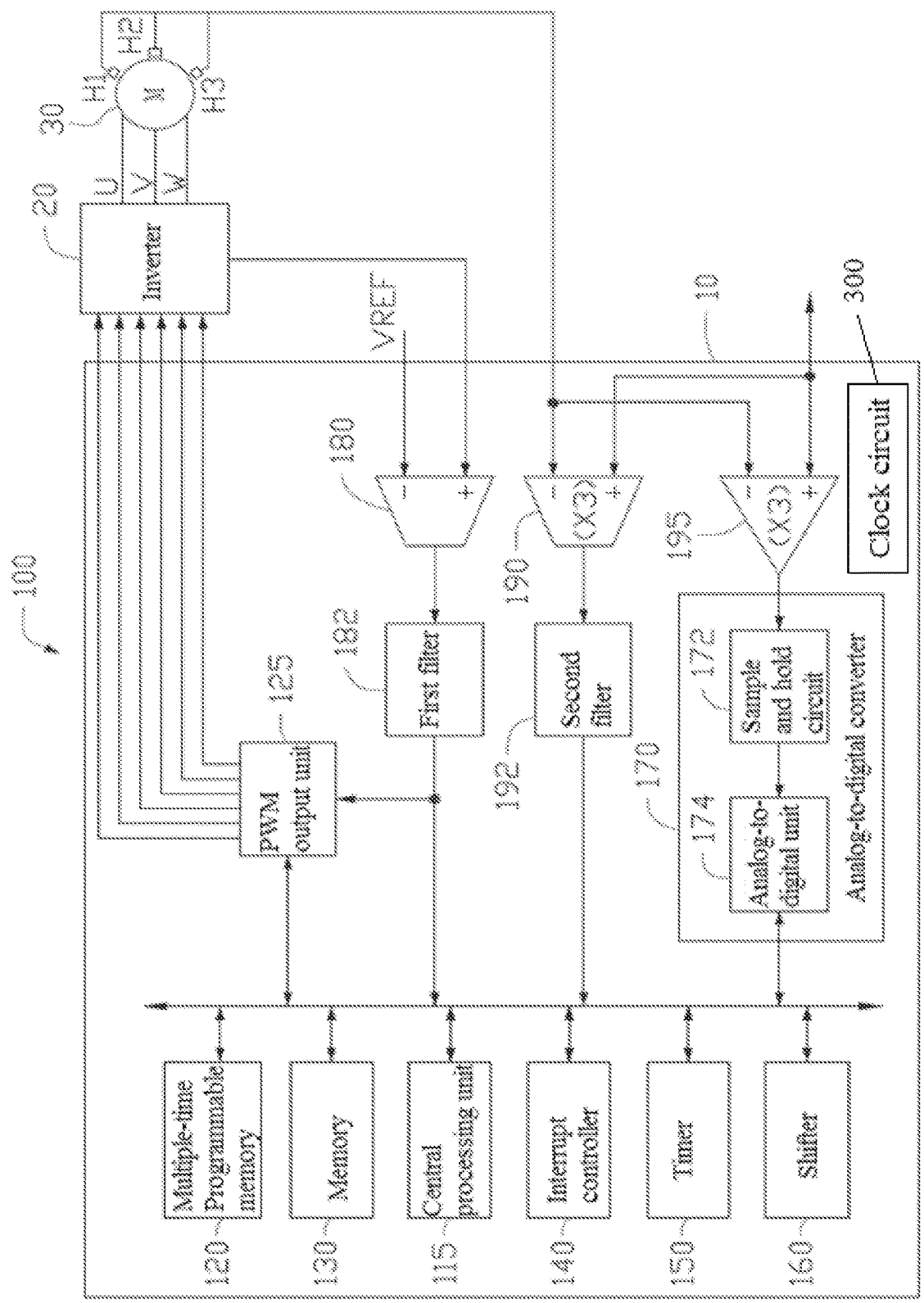
FIG. 1 shows a block diagram of a motor device according to one embodiment of the present disclosure.
Figure 2:
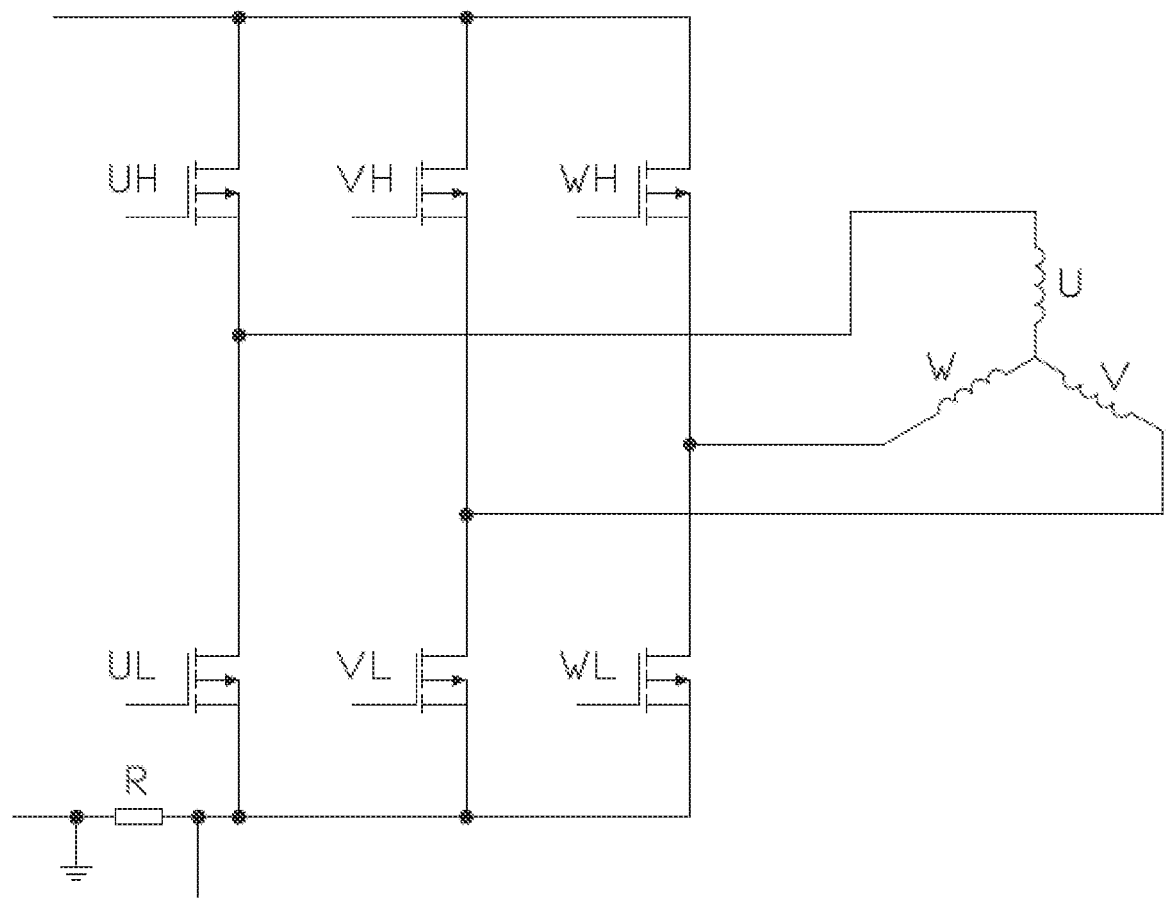
FIG. 2 shows a circuit diagram of an inverter and a motor winding of FIG. 1.

Hereinafter, particular embodiments of the present disclosure are described in detail in conjunction with the drawings, so that technical solutions and other beneficial effects of the present disclosure are apparent. It can be understood that the drawings are provided only for reference and explanation, and are not used to limit the present disclosure. Dimensions shown in the drawings are only for ease of clear description, but are not limited to a proportional relationship.

FIG. 1 shows a motor device 100 according to one embodiment. The motor device 100 can include a motor 30, a motor-driven integrated circuit 10, and an inverter 20. In the embodiment, the motor 30 can be a brushless direct current motor (BLDC), or a permanent magnet synchronous motor (PMSM). The motor 30 can include a stator and a rotor rotatably received in the stator. The stator can a stator core and a stator winding wound around on the stator core. The stator core can be made of soft magnetic materials such as pure iron, cast iron, cast steel, electrical steel, silicon steel. The rotor can include a plurality of permanent magnet.

In the embodiment, the motor 30 can be a three phase BLDC. The stator core can include three phases labeled as, U, V, and W. One end of the three phases U, V, and W is electrically coupled to the inverter 20, and the other end of the three phases U, V, and W is electrically coupled to a neutral point. In the embodiment, the stator winding is connected in Y-shaped. In another embodiment, the stator winding can be connected in triangular shaped.

In the embodiment, the inverter 20 can be a three-phase bridge inverter. The inverter 20 can include six semiconductor switches. The U phase winding is electrically coupled with a node between an upper side switch UH and a lower side switch UL. The V phase winding is electrically coupled with a node between an upper side switch VH and a lower side switch VL. The W phase winding is electrically coupled with a node between an upper side switch WH and a lower side switch WL. The motor-driven integrated circuit 10 outputs a drive signal, such as, a PWM signal, to the inverter 20. Each switch is controlled by the control signal to switch on and switch off. The two switches in each bridge are interlocked, that is only one switch can be turned on in each bridge. In the embodiment, each switch can be a MOSFET. In another embodiment, each switch can be selected from insulated gatebipolar transistor (IGBT), or BJT.

In another embodiment, the motor 30 can be a single phase, two phase or multiple phase BLDC.

The motor 30 can further include a position sensor to sense a position of the rotor. In the embodiment, the motor 30 can include three Hall sensors, which are labeled as H1, H2, and H3, respectively. The three Hall sensors H1, H2 and H3 are arranged at an electrical angle of 120 degrees in the circumferential direction of the rotor. In another embodiment, the three Hall sensors H1, H2, H3 may be arranged in turn along the circumferential direction of the rotor at other electrical angles, such as 60 degrees. The Hall sensors H1, H2 and H3 output logic high or low level pole detection signals according to a direction of magnetic fluxes through the Hall sensors H1, H2 and H3, and each edge of the pole detection signal indicates a change of a polarity of the rotor.

The motor-driven integrated circuit 20 can include a housing, a semiconductor substrate arranged in the housing, a plurality of input and output (I/O) interfaces extending from the housing. The motor-driven integrated circuit 20 can include a central processing unit (CPU) 115, a memory 130, a Multiple-Time Programmable (MTP) memory 120, a timer 150, a shifter 160, a PWM output unit 125, an overcurrent comparator 180, a plurality of position comparators 190, a plurality of operation amplifiers 195, a first filter 182, a second filter 192, an Analog-to-Digital Converter (ADC) 170, and a clock circuit 300. The PWM output unit 125, the overcurrent comparator 180, the plurality of position comparators 190, the plurality of amplifiers 195 and the ADC 170 are electrically coupled to the I/O interfaces. In the embodiment, the CPU 115 can be a 8-bit Single Chip Micyoco (SCM), an operating frequency of the SCM can be 80 MHz.

The CPU 115 is electrically coupled to the memory 130, the MTP memory 120, the shifter 160, the timer 150, the PWM output unit 125, the first filter 182, the second filter 192, and the ADC 170 via a bus.

The CPU 115 is a central control center of the motor device 100. The memory 130 can temporarily store operation data of the CPU 115. The MTP memory 120 can store a configuration data of the motor device 100 and a plurality of driven programs of the motor device 100.

The motor-driven integrated circuit 20 can include three position comparators 190. Each position comparator can receives a pole detection signal which denotes a position of the rotor. Each position comparator can compare the pole detection signal with a reference value and output a comparison result signal. Output ends of the three position comparators 190 are electrically coupled to the CPU 115 via the second filter 192. The rotor pole position is obtained by the CPU 115 according to the pole detection signals output by the three Hall sensors. In the embodiment, the pole detection signals are denoted as 011, 001, 101, 100, 110, and 010 between a 360 degrees electrical cycle. The CPU 115 controls the PWM output unit 125 output the drive signal to drive the motor 30. When the three pole detection signals are 011, the CPU 115 controls the PWM output unit 125 output the drive signal to turn on the upper side switch UH and the lower side switch WL. In the embodiment, the pled detection signals are square wave.

In another embodiment, the position sensors can be omitted. The CPU can obtain the rotor position via a sensorless method. When the motor 30 rotates, a back electromotive force is generated in the stator winding. The rotor position can be obtained by detecting a zero crossing of the back electromotive force with the position comparators 190.

The plurality of operation amplifiers 195 can be used in Field Oriented Control (FOC) of PMSM. In the embodiment, the plurality of operation amplifiers 195 simultaneously collect currents of the two-phase windings in the three-phase windings and then amplifies them to the analog-to-digital converter 170, and calculates the other phase according to the result of the conversion. And the central processing unit 115 obtains a rotation speed of the motor by Park positive and negative transformation based on the currents of each phase winding. In the embodiment, the current acquired by the operation amplifier 195 is a sine wave, and it is understood that the current acquired by the operation amplifier 195 may be other waveforms.

Output ends of the plurality of operation amplifiers 195 are electrically coupled to the analog-to-digital converter 170. The analog-to-digital converter 170 can include a sample and hold circuit 172 and an analog-to-digital unit 174. The analog-to-digital unit 174 can convert an analog signal output by the operation amplifier 195 to a digital signal. The sample and hold 172 is configured to ensure an accuracy of the analog-to-digital unit 174.

The PWM output unit 125 can include a plurality of output ends. In the embodiment the PWM output unit 125 can include six output ends. Each output end is electrically coupled to one semiconductor switch of the inverter 20. The PWM output unit 125 is controlled by the CPU 115 to output drive signals to turn on and off the semiconductor switch of the inverter 20.

One input end of the overcurrent comparator 180 receives a detection signal which denotes an operation current of the motor 30, the other input end of the overcurrent comparator 180 receives a reference value VREF. An output end of the overcurrent comparator 180 is electrically coupled to the PWM output unit 125 and the CPU 115 via the first filter 182.

Figure 5:
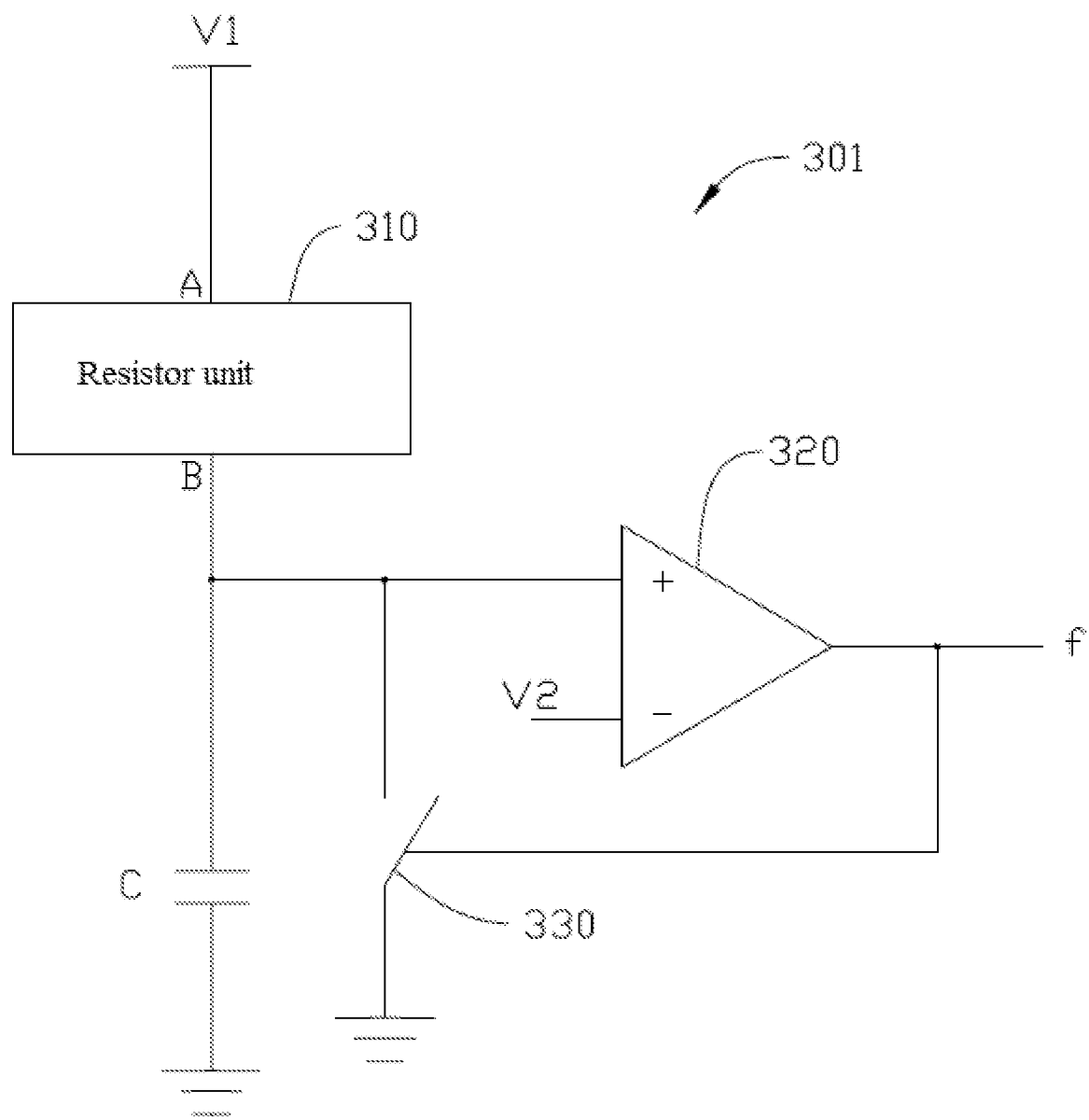
FIG. 5 shows a block diagram of a RC oscillator having a resistor unit according to one embodiment.

The clock circuit 300 is configured to provide a stable system clock for the motor-driven integrated circuit 10. In the embodiment, the clock circuit 300 can include a RC oscillator 301. As shown in FIG. 5, the RC oscillator 301 can include a resistor unit 310, a capacitor C, a comparator 320 and an electric switch 330. The resistor unit 310 and the capacitor C are coupled between a power source V1 and a ground terminal in series. A node between the resistor unit 310 and the capacitor C is coupled a non-inverting input terminal of the comparator 320. An inverting input terminal of the comparator 320 receives a reference voltage V2. The electric switch 330 is coupled between the inverting input terminal of the comparator 320 and the ground terminal. A control terminal of the electric switch 330 is electrically coupled to an output terminal of the comparator 320. The capacitor C is charged via the resistor unit 310 by the power source V1. When a voltage across the capacitor C exceeds the reference voltage V2, the comparator 320 is turned over and the electric switch 330 is turned on to discharge the capacitor C. When a voltage across the capacitor C is lower than the reference voltage V2, the electric switch 330 is turned off and the capacitor 3 is charged again. The system clock signal with a predetermined frequency is output by the output terminal of the comparator 320 by alternately charging and discharging the capacitor C. The RC oscillator 301 in the motor-driven integrated circuit 10 is not limited to the form shown in the figures, and any other known RC oscillator may also be used.

A frequency f of the system clock signal of the RC oscillator 301 is determined the formula:

$$f = \frac{1}{T} = \frac{V1}{V2*R*C},$$

where R is a resistance of the resistor unit 310, C is a capacitance of the capacitor C. The frequency of the system clock signal can be changed via changing a resistance of the resistor unit 310. In the embodiment, a highest frequency of the system clock signal is larger than 50 MHz and is not less than 80 MHz.

Figure 6:
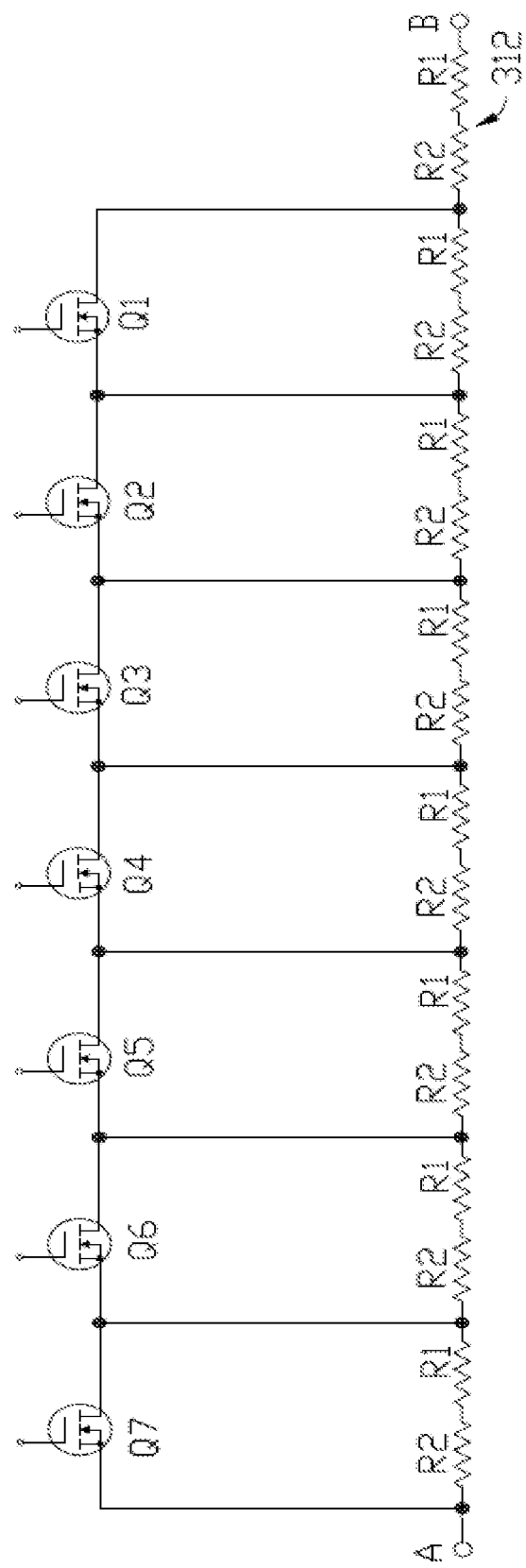
FIG. 6 shows a circuit diagram of the resistor unit of FIG. 5.

Referring to FIG. 6, the resistor unit 310 can include at least one set of compensation resistor 312. In the embodiment, the resistor 310 can include eight sets of compensation resistors 312. Each set of compensation resistor 312 can include a first resistor R1 having a positive temperature compensation coefficient and a second resistor R2 having a negative temperature compensation coefficient. The resistor unit 310 can further include seven selection switches Q1-Q7. The eight sets of compensation resistors 312 are coupled between a first node A and a second node B in series. The first node A is coupled with the power source 1, the second node is coupled with the capacitor C. Each selection switch is coupled with one set of compensation resistor 312 in parallel except one set of compensation resistor 312.

In the embodiment, the selection switches Q1-Q7 are N-metal oxide semiconductor (NMOS) transistor. A control signal is input to a gate of each of the selection switches Q1-Q7. A drain and a source of each of the selection switches Q1-Q7 are coupled two ends of each of set of compensation resistor 312. When a high level control signal is input to the selection switches Q1-Q7, the selection switches Q1-Q7 are turned on, the compensation resistor 312 corresponding to turned on selection switch is short circuit. When a low level control signal is input to the selection switches Q1-Q7, the selection switches Q1-Q7 are turned off, the compensation resistor corresponding to turned off selection switch is conducted. The compensation resistor 312 can be selected to conduct by controlling a level of the control signal outputted to the selection switches Q1 to Q7 so that the RC oscillator 301 outputs the system clock signal with different frequencies. As can be seen from the above formula, a greater resistance in the RC oscillator 301, a lower frequency of the system clock signal can be achieved.

The resistances of the first resistor R1 and the second resistor R2 are substantially offset from each other due to temperature changes during operation of the motor-driven integrated circuit 10. The resistance of each set of compensation resistors 312 is substantially constant. The temperature coefficient of the resistor is determined by a material of the resistor. The material of the first resistor R1 and the second resistor R2 are selected according to the resistance at room temperature with nominal resistance value.

In the embodiment, the second resistor R2 with the negative temperature coefficient can be selected from P+ poly w/o silicide and N+ poly w/o silicide. The first resistor R1 with the positive temperature coefficient can be selected from N+ diff w/o silicide, P+ poly w/i silicide, P+ diff w/o silicide, P+ diff w/i silicide, N+ poly w/I silicide, N+ diff w/i silicide.

In the embodiment, a sum of nominal value of the positive and negative temperature coefficient resistors is equal to a resistance of the each set of compensation resistor 312, that is, R'=R1+R2. A product (R1*K1) of a resistance (R1) of the first resistor R1 with the positive temperature coefficient and a linear temperature coefficient (TC1) K1 is equal to a product (R2*K2) of a resistance (R2) of the second resistor R2 with the negative temperature coefficient and a linear temperature coefficient K2. Where R' is the resistance of the set of compensation resistor 312, R1 is the resistance of the first resistor R1, R2 is the resistance of the second resistor R2, K1 is the linear temperature coefficient of the positive temperature coefficient resistor, K2 is the linear temperature coefficient of the negative temperature coefficient resistor. In the embodiment, a second order temperature coefficient of the resistor is substantially constant. If a resistance R' of one set of compensation resistor 312 is 5 K ohms, a negative temperature coefficient resistor with temperature coefficient −1 and 4 K ohms and a positive temperature coefficient resistor with temperature coefficient −4 and 1 K ohms can be selected to connect in series.

In the embodiment, the capacitor C can be a metal insulator metal capacitor. The first resistor R1 is N+ diff w/o silicide resistor, the second resistor R2 is P+ poly w/i silicide resistor. When an absolute value of the temperature coefficient of the first resistor R1 is larger than an absolute value of the temperature coefficient of the second resistor R2, particularly when a ratio of the absolute value of the temperature coefficient of the first resistor R1 and the temperature coefficient of the second resistor R2 is less than ten, the frequency of the system clock signal of the RC oscillator is not substantially changed between −40° C. to +85° C., a variation change of the frequency is less than 2%. In the embodiment, the second order temperature coefficients of the positive and negative temperature coefficient are less than 1E-6/° C. In the embodiment, the linear temperature coefficient of N+ diff w/o silicide resistor R1 is 1.46E-3/° C., the second order temperature coefficient is 5.57E-7/° C.; the linear temperature coefficient of P+ poly w/i silicide resistor R2 is 1.68E-4/° C., the second order temperature coefficient is 7.04E-7/° C.

An 8-bit microcontroller is usually operated in a low frequency, such as 20-50 MHz. The 8-bit microcontroller with low frequency cannot meet the real-time requirements for the motor control, and the real-time motor drive chip is usually used at least 16-bit microcontroller with a higher cost. In the embodiment, the motor-driven integrated circuit is fabricated using a 0.15 m semiconductor process with a higher operating frequency (e.g., 80 MHz), which can improve the processing speed and meet the real-time requirements for motor control. On the other hand, the 8-bit microcontroller can significantly reduce cost, and 0.15 μm process can reduce a size of bare die to 8~9 mm². In contrast, if the 0.25 μm process, the operating frequency is less than 50 MHz, the 0.35 μm process, the clock frequency is 20~30 MHz, and die area will increase proportionally.

When the motor device 100 is powered or reset, the CPU 115 firstly performs a boot loader program, and copy all program codes from the Multiple-Time Programmable memory 120 memory 120 to the memory 130. The Multiple-Time Programmable memory 120 stores motor configuration data and motor driven programs. In the embodiment, the configuration data and the motor driven programs can be stored in the Multiple-Time Programmable memory 120. Compared with Flash memory, in particular to large-scale manufacturing, the Multiple-Time Programmable memory 120 can reduce cost. In the embodiment, a capacity of the Multiple-Time Programmable memory 120 is 32 KB. In another embodiment, the capacity of the Multiple-Time Programmable Memory 120 can be 48 KB, 64 KB. A capacity of the memory 130 is 48 KB, the capacity of the memory 130 is larger than the capacity of the Multiple-Time Programmable memory 120. In the embodiment, the memory 130 can be a random access memory (RAM). As the memory 130 has a higher operating frequency than the Multiple-Time Programmable memory 120, all program codes in the MTP 130 are copied to the memory, the motor-driven integrated circuit 10 accelerates operating frequency with a low cost.

In a power-on period of the motor-driven integrated circuit, the clock circuit 300 provides a lower frequency system clock, which causes the motor-driven integrated circuit to operate at low frequency. And then the motor-driven integrated circuit switches to a high frequency operation, thus a possibility of a collapse of the motor-driven integrated circuit during the power-on period can be avoided. In the embodiment, the motor-driven integrated circuit may operate at a system clock with 80 MHz in a normal operating state. The system clock frequency is not higher than 30 MHz during the power-on period. In one embodiment, during the power-on period, the clock circuit 300 outputs the frequency of the system clock signal can be one quarter of the highest frequency of the system clock signal, i.e. 20 MHz.

An adjustment of the system clock frequency can be achieved by setting the selection switches Q1-Q7. During the power-on period, the seven selection switches Q1-Q7 are turned off, the eight sets of compensation resistors 312 are conducted, a low frequency of the system clock is achieved. During the normal operating state, some selection switches Q1-Q7 are turned on and the other selection switches Q1-Q7 are turned off, a specific frequency of the system clock is achieved. In the embodiment, the frequency of the system clock is adjusted by adjusting the resistance of compensation resistor 312 connected to the RC oscillator 301 shown in FIGS. 5 and 6, and in another embodiment, the frequency of the system clock can also be adjusted by individually adjusting a capacitance of the RC oscillator or by adjusting the resistance and capacitance of the RC oscillator, for example, referring to the RC oscillator 700 shown in FIG. 7 and the RC oscillator 800 shown in FIG. 8.

Figure 7:
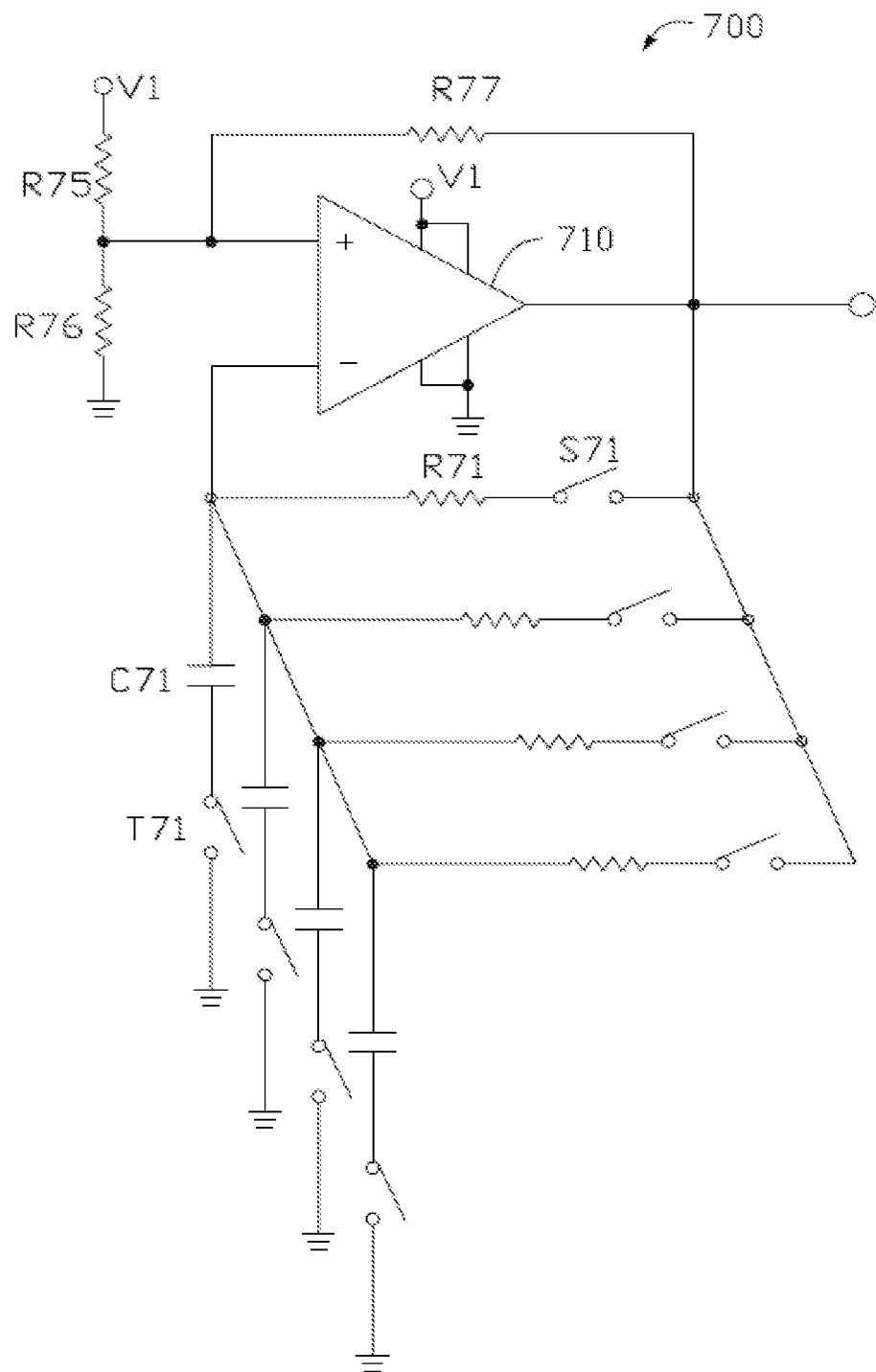
FIGS. 7 and 8 show a block diagram of a RC oscillator according to another embodiment.

As shown in FIG. 7, the RC oscillator 700 can include a comparator 710, a plurality of resistors R71, R75-R77, a capacitor C71, and two electric switches S71 and T71. The power source V1 is grounded via the resistors R75 and R76. A node between the resistors R75 and R76 is electrically coupled to a non-inverting input terminal of the comparator 710. The comparator 710 outputs a system clock signal with a specific frequency. An output terminal of the comparator 710 is electrically coupled to the non-inverting input terminal of the comparator 710 via the resistor R77. A plurality of resistor branches are connected in parallel between the output terminal of the comparator 710 and the inverting input terminal of the comparator 710, each resistor branch can include the resistor R71 and the electric switch S71 which are connected in series. A plurality of capacitor branches are connected in parallel between the output terminal of the comparator 710 and the ground terminal, each capacitor branch can include the capacitor C71 and the electric switch T71. The frequency of the system clock signal can be adjusted by adjusting a resistance of the plurality of resistor branches and/or a capacitance of the plurality of capacitor branches.

Figure 8:
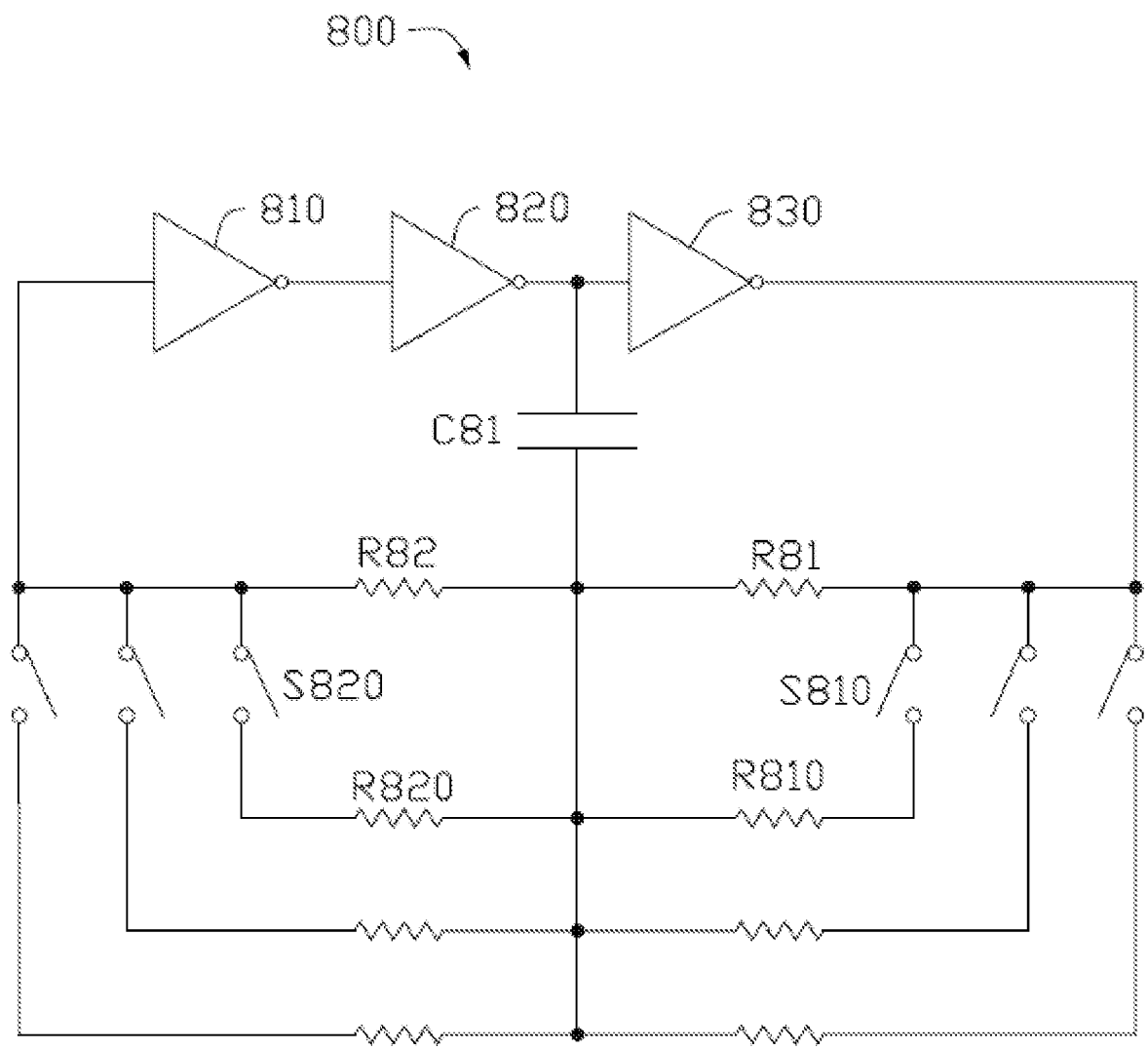

In FIG. 8, the RC oscillator 800 can include three not-gates 810, 820, and 830, a capacitor C81, a plurality of resistors R81, R82, R810, and R820, and two electric switches S810 and S820. The not-gates 810, 820, and 830 are coupled in series. An output terminal of the not-gate 830 is coupled to an input terminal of the not-gate 810. A node between the not-gates 820 and 830 is electrically coupled to a node between the resistors R81 and R82 via the capacitor C81. A plurality of resistor branches are coupled two ends of the resistor R82 in parallel, each resistor branch can include the resistor R820 and the electric switch S820 in series. The frequency of the system clock signal can be adjusted by adjusting a resistance of the plurality of resistor branches.

Figure 3:
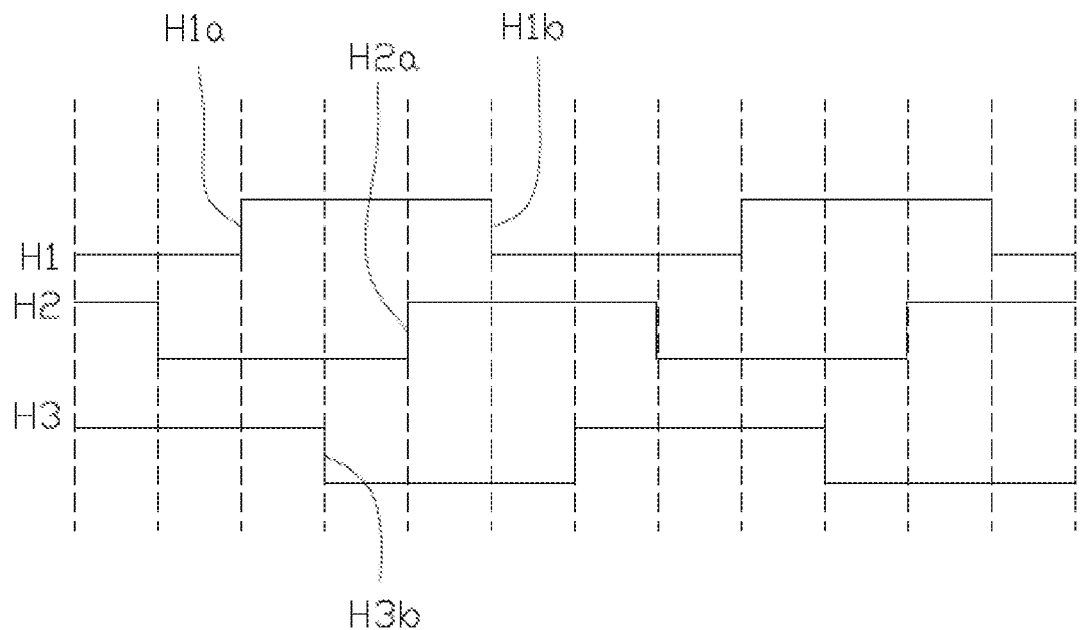
FIG. 3 shows a waveform of a Hall sensor of FIG. 1.
Figure 4:
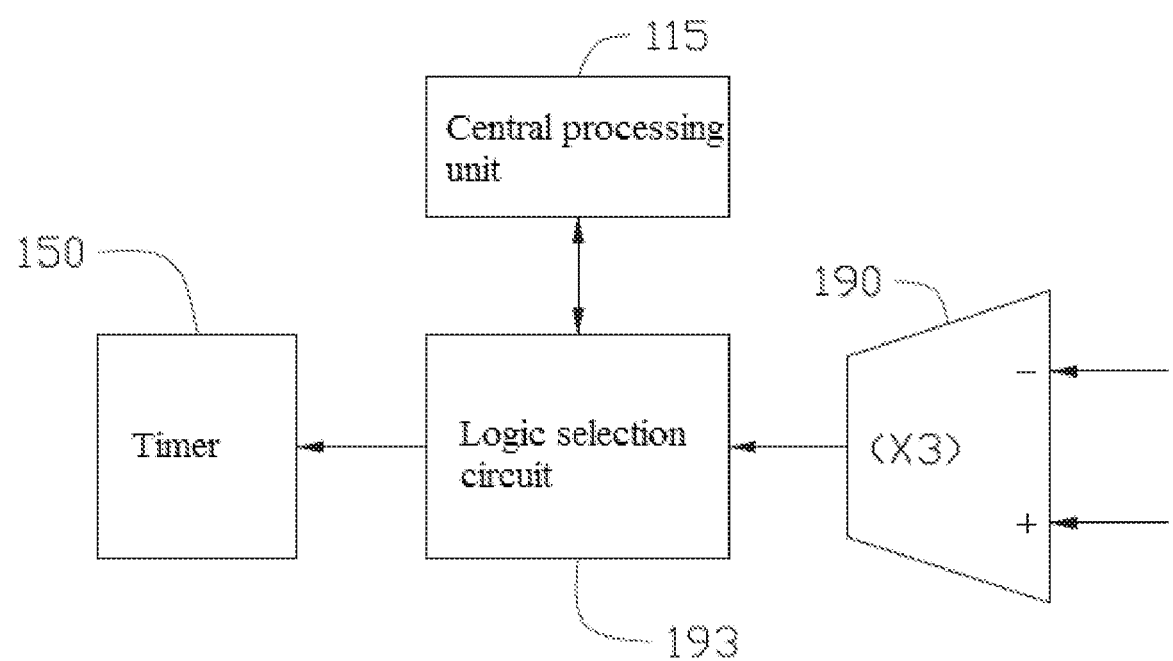
FIG. 4 shows a block diagram of a CPU of a motor-driven integrated circuit is coupled to a timer via a logic selection circuit according to one embodiment.

In another embodiment, the motor drive integrated circuit 10 can include an LC oscillator. The frequency of the system clock signal can be adjusted by adjusting a clock frequency output by the LC oscillator. In another embodiment, the frequency of the system clock signal can be adjusted by dividing or multiplying a clock frequency of a clock signal output by an external crystal oscillator. The Hall sensors H1, H2, and H3 output three pole detection signals to the three position comparators 190, respectively. As shown in FIG. 3, the three pole detection signals are mutually different with 120 degree electrical angle. When the position comparator 190 obtains a level transition of the pole detection signal, that is a rising edge or a falling edge, the position comparator 190 outputs a timing interrupt signal to the timer 150.

A first position comparator obtains a rising edge H1a, and the first position comparator outputs a timing interrupt signal to the timer 150 and the timer 150 records a time t0. When a next edge is generated, such as a falling edge H3b, the third position comparator outputs a timing interrupt signal to the timer 150 and the timer 150 records a time t1. The CPU 115 obtains a rotation speed of the motor 30 via a time difference Δt between t0 and t1.

After the time t1 is recorded, the timer 150 clears the time t0 and records time t1 as time t0. When a next edge is generated, such a rising edge H2a, the second comparator outputs a timing interrupt signal to the timer 150. The CPU 115 obtains a rotation speed of the motor via a time difference Δt between t0 and t1. And then the rotation speed of the motor is obtained by calculating the time difference between the rising edge H2a and the falling edge H1b as follows. In the motor running stage, the CPU 115 determines the operating condition of the motor by calculating the rotational speed of the motor by the time difference of every two adjacent edges.

In the embodiment, it is possible to detect not only the time difference of adjacent edges but also the time difference at which the adjacent edge or adjacent rising and falling edges of the Hall signal can be detected as necessary. In another embodiment, the position comparator 190 are electrically connected to a logic selection circuit 193 which is coupled to the central processing unit 115 and the timer 150. The logic selection circuit 193 selects two adjacent edges of one Hall signal, the two adjacent rising edges of one Hall signal, the two adjacent falling edges of the one Hall signal, the two adjacent edges of two Hall signals, the two adjacent rising edges of two Hall signals, or the two adjacent falling edge of two Hall signals according to a setting of the central processing unit 115. The timer 150 is controlled to time according to the two edges selected by the logic selection circuit 193.

Each position comparator is needed to connect an interrupt controller. In the embodiment, the position comparators 190 are directly coupled to the timer 150 or coupled to the timer 150 via the logic selection circuit 193. The interrupt controller can be omitted. And the timer 150 counts in response to the edge of each Hall signal, a sampling frequency is fast. It is obvious that a faster sampling, a better dynamic response can be obtained. The motor can operate more smoothly and reduce a speed fluctuation. The logic selection circuit is provided in the motor-driven integrated circuit 10, it is possible to select the different edges to calculate the rotation speed of the motor so that the motor-driven integrated circuit 10 can be adapted to different motor devices to improve the versatility of the motor.

The motor-driven integrated circuit 10 can further include a shifter 160. In the embodiment, the shifter 160 can be a barrel shifter. The shifter 160 can perform a shift operation bits in a plurality of ways such as multiplication and division in a single cycle. For example, if all the operations are performed by the CPU 115, the operation of the system will be slowed down, and the operation such as multiplication and division is performed by the shifter 160, and the shift operation becomes faster, And the shift operation is not performed by the CPU 115, the CPU 115 can be released for performing other operation, and an efficiency of the entire motor-driven integrated circuit 10 can be increased.

During the operation of the motor, the overcurrent comparator 180 receives a detection signal indicative of the operating current of the motor. In the embodiment, a sampling resistor R is coupled the inverter 20 and a ground. The operating current of the motor is converted into a sampling voltage by the sampling resistor R. The overcurrent comparator 180 receives the sampling voltage and compares the sampling voltage with the reference value VREF. When the sampling voltage is larger than the reference value VREF, the overcurrent is generated in the motor, and the overcurrent comparator 180 outputs an overcurrent protection signal to the PWM output unit 125. The PWM output unit 125 can enter an overcurrent protection mode according to the overcurrent protection signal. In this way, the overcurrent comparator 180 directly controls the PWM output unit 125 to enter the overcurrent protection mode when the overcurrent is generated in the motor, and the PWM output unit 125 responds quickly to the overcurrent of the motor and can protect the motor quickly and efficiently. In another embodiment, the overcurrent comparator 180 outputs the overcurrent protection signal to the central processing unit 115, and then the central processing unit 115 controls the PWM output unit 125 to enter the overcurrent protection mode.

When the PWM output unit 125 enters the overcurrent protection mode, the PWM output unit 125 may perform one of the following operations, for example, to stop outputting the drive signal to the inverter 20, to reduce a duty of the drive signal output to the inverter 20, to stop outputting the drive signal to the inverter 20 and reset to output the drive signal after a preset time delay. The specific operation in the overcurrent protection mode can be performed according to the design requirements or the environment of the motor application.

The first filter 182 is coupled between the overcurrent comparator 180, the PWM output unit 125 and the central processor 115. The first filter 182 may be configured to sample the overcurrent protection signal in a predetermined manner. The predetermined manner can be that the first filter 182 samples the overcurrent protection signal for a predetermined number of times in a predetermined cycle, the first filter 182 samples the overcurrent protection signal in two cycles. The first filter 182 determines whether the overcurrent is generated according to sample values. The first filter 182 is configured to eliminate a glitch signal. The second filter 192 has a similar function and will not be described again. In the embodiment, the first filter 182 and the second filter 192 are Glitch Filter.

In another embodiment, the motor-driven integrated circuit 10 can include an interrupt controller 140. When the overcurrent is generated in the motor, the overcurrent comparator simultaneously outputs the overcurrent protection signal to the interrupt controller 140 and the PWM output unit 125. The interrupt controller 140 sends an interrupt signal to the CPU 115, which controls an external device, such as a display, an alarm, etc., to indicate that the motor 30 is in a fault condition based on the interrupt signal.

In the embodiment, the overcurrent comparator 180 is integrated in the motor-driven integrated circuit 10, which reduces a number of electronic components used compared to the prior art and reduces an overall size of the motor control circuit. The motor-driven integrated circuit can run with a low power consumption and a high reliability.

The motor device 100 according to the embodiment can also be applied to an application device, which may be one of a pump, a fan, a household appliance, a vehicle, etc. The household appliance can be a washing machine, a dishwasher, a rangehood, an exhaust fan and so on.

In the description and claims of the present application, each of the verbs "comprise", "include", "contain" and "have", and variations thereof, are used in an inclusive sense, to specify the presence of the stated item or feature but do not preclude the presence of additional items or features.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The embodiments described above are provided by way of example only, and various other modifications will be apparent to persons skilled in the field without departing from the scope of the invention as defined by the appended claims.

The invention claimed is:

1. A motor driving integrated circuit, comprising:
a RC oscillator including a resistor unit having at least one set of compensation resistor, wherein each set of compensation resistor comprises a positive temperature coefficient resistor and a negative temperature coefficient resistor coupled in series with the positive temperature coefficient resistor; and wherein during a power-on period of the motor driving integrated circuit, a frequency of a system clock signal output by the RC oscillator is one quarter of a highest frequency of the system clock signal.

2. The motor driving integrated circuit of claim 1, wherein the RC oscillator comprises a plurality of sets of compensation resistor.

3. The motor driving integrated circuit of claim 2, wherein the plurality of sets of compensation resistor are coupled in series, each of or some of plurality of sets of compensation resistor are coupled with a selection switch in parallel.

4. The motor driving integrated circuit of claim 2, wherein the plurality of sets compensation resistor are disposed in a plurality of parallel branches, each of or some of plurality of parallel branches are coupled with a selection switch in series.

5. The motor driving integrated circuit of claim 1, wherein the positive temperature coefficient resistor is made of at least one of N+ diff w/o silicide, P+ poly w/i silicide, P+ diff w/o silicide, P+ diff w/i silicide, N+ poly w/i silicide, N+ diff w/i silicide.

6. The motor driving integrated circuit of claim 1, wherein the negative temperature coefficient resistor is made of at least one of P+ poly w/o silicide and N+ poly w/o silicide.

7. The motor driving integrated circuit of claim 1, wherein the positive temperature coefficient resistor is made of N+ diff w/o silicide and the negative temperature coefficient resistor is made of N+ poly w/o silicide.

8. The motor driving integrated circuit of claim 7, wherein an absolute value of a linear temperature coefficient of the positive temperature coefficient resistor is larger than an absolute value of a linear temperature coefficient of the negative temperature coefficient resistor.

9. The motor driving integrated circuit of claim 8, wherein a ratio of the absolute value of the positive temperature coefficient resistor and the negative temperature coefficient resistor is less than ten.

10. The motor driving integrated circuit of claim 8, wherein second order temperature coefficients of the positive and negative temperature coefficient resistors are less than 1E-6/° C.

11. The motor driving integrated circuit of claim 1, further comprising a capacitor is coupled with the resistor unit in series, wherein the capacitor is a metal insulator metal capacitor.

12. The motor driving integrated circuit of claim 1 wherein a highest frequency of a system clock signal output by the RC oscillator is larger than 50 MHz.

13. The motor driving integrated circuit of claim 1, wherein a highest frequency of a system clock signal output by the RC oscillator is not less than 80 MHz.

14. The motor driving integrated circuit of claim 1, wherein during a power-on period of the motor driving integrated circuit, a frequency of the system clock signal is 20 MHz-30 MHz.

15. A motor device, comprising a motor driving integrated circuit of claim 1.

16. The motor driving integrated circuit of claim 1, further comprising:
a multiple-time programmable memory storing a motor driving program;
a memory having a capacity larger than or equal to a capacity of the multiple-time programmable memory; and
a central processing unit; wherein when the motor driving integrated circuit is powered or reset, a boot loader is performed and the motor driven program is copied to the memory by the central processing unit from the multiple-time programmable memory, and the motor driving program is performed by the central processing unit from the memory.

17. The motor driving integrated circuit of claim 16, further comprising:
a plurality of position comparators, each of the plurality of position comparators receiving a pole detection signal denoting a position of a rotor of a motor;
a timer receiving a timing interrupt signal output by the plurality of position comparators when a predetermined edge of the pole detection signal generated and recording a time of the predetermined edge;
a logic selection circuit coupled between the plurality of position comparators and the timer, the logic selection circuit selecting two adjacent edges of the pole detection signal and controlling the timer to start; and
the central processing unit obtaining a rotation speed of the motor according to a time difference between two adjacent edges selected by the logic selection circuit.

* * * * *